(12) United States Patent
Peckerar et al.

(10) Patent No.: US 8,052,908 B2
(45) Date of Patent: Nov. 8, 2011

(54) PHOTOLITHOGRAPHIC MASK EXHIBITING ENHANCED LIGHT TRANSMISSION DUE TO UTILIZING SUB-WAVELENGTH APERTURE ARRAYS FOR IMAGING PATTERNS IN NANO-LITHOGRAPHY

(75) Inventors: Martin C. Peckerar, Silver Spring, MD (US); Mario Dagenais, Chevy Chase, MD (US); Birendra Dutt, Westchester, CA (US); John D. Barry, College Park, MD (US); Michael D. Messina, Jr., Southport, CT (US); Yves Ngu, Greenbelt, MD (US)

(73) Assignee: University of Maryland, College Park, MD (US)

( * ) Notice: Subject to any disclaimer, the term of this patent is extended or adjusted under 35 U.S.C. 154(b) by 0 days.

(21) Appl. No.: 12/114,373

(22) Filed: May 2, 2008

(65) Prior Publication Data
US 2009/0068570 A1     Mar. 12, 2009

Related U.S. Application Data

(60) Provisional application No. 60/924,179, filed on May 2, 2007.

(51) Int. Cl.
*B29C 33/40*     (2006.01)

(52) U.S. Cl. ...................................................... 264/219

(58) Field of Classification Search .................. 264/219; 425/174.4; 430/5
See application file for complete search history.

(56) References Cited

OTHER PUBLICATIONS

Srituravanich, et al. "Deep subwavelength nanolithography using localized surface plasmon modes of planar silver mask" J. Vac. Sci. Technol. B 23(6), Dec. 2005, p. 2636-2639.*
T.W. Ebbesen et al., "Extraordinary optical transmission through sub-wavelength hole arrays", Nature, vol. 391, Feb. 1998, pp. 667-669.

* cited by examiner

*Primary Examiner* — Christina Johnson
*Assistant Examiner* — Larry Thrower
(74) *Attorney, Agent, or Firm* — Rosenberg, Klein & Lee

(57) ABSTRACT

A nanophotolithography mask includes a layer of an electrically conductive optically opaque material deposited on a mask substrate in which regular arrays of sub-wavelength apertures are formed. The plasmonic excitation in the layer perforated with the sub-wavelength apertures arrays under the light incident on the mask produces high resolution far-field radiation patterns of sufficient intensity to expose a photoresist on a wafer when propagated to the same. The fill-factor of the mask, i.e., the ratio of the total apertures area to the total mask area, may lead to a significant increase in mask manufacturing throughput by FIB or electron beam "writing". The mask demonstrates the defect resiliency and ability to imprint coherent clear features of nano dimensions and shapes on the wafers for integrated circuits design.

4 Claims, 11 Drawing Sheets

FEATURE SIZE OPTIMIZATION APPROACH

PHOTOLITHOGRAPHIC MASK EXHIBITING ENHANCED LIGHT TRANSMISSION DUE TO UTILIZING SUB-WAVELENGTH APERTURE ARRAYS FOR IMAGING PATTERNS IN NANO-LITHOGRAPHY

This utility Patent Application is based on the Provisional Patent Application Ser. No. 60/924,179 filed 2 May 2007.

STATEMENT REGARDING FEDERALLY SPONSORED RESEARCH OR DEVELOPMENT

The development of the invention described herein was funded by the U.S. Naval and Air Systems Command (NAVAIR) under Grant Number N004210310002. The U.S. Government has certain rights in this invention.

FIELD OF THE INVENTION

The present invention relates to photolithography, and in particular to an ultra-high resolution nano-lithographic system for "imprinting" nano-sized features on a substrate (wafer).

More in particular, the present invention is directed to a photolithographic mask for use in a nano-lithographic process for imaging patterns on wafers.

In overall concept, the present invention relates to a photolithographic mask exhibiting enhanced light transmission due to plasmonic excitation of the incident light in a sub-wavelength aperture array formed in a metal film of the mask to collect and re-radiate optical energy suitable for imaging patterns on wafers in the fabrication of integrated circuits.

The present invention is also directed to fabrication of photolithographic masks which utilize an array of clear sub-wavelength apertures impressed on an opaque surface coating of the mask. The reduced fill-factor (e.g. the ratio of clear-to-opaque area) of the mask results in a substantial reduction in "writing time" of the mask and in a significant increase in the mask fabrication throughput.

Furthermore, the present invention is related to a photolithographic mask for nano-lithography where defects (absent apertures) in the photolithographic mask make minimal or no impact on the quality of a projected image on a wafer.

Additionally, the present invention relates to photolithographic masks, e.g., metal films perforated with regular arrays of sub-wavelength apertures in which plasmonic excitation is generated to produce high resolution far-field radiation patterns of sufficient intensity to expose photoresist when propagated through an optical system in photolithographic printing.

BACKGROUND OF THE INVENTION

The interaction between light and a hole in an opaque screen has been the object of curiosity in technology application for centuries. Grimaldi (F. M. Grimaldi, Physico-Mathesis De Lumine, Coloribus, et Iride, 9, 1665) first described diffraction from a circular aperture thereby providing an experimental basis for classical wave optics in the 17th century. Conventional diffraction theory of light transmission through a sub-wavelength aperture predicts a strongly attenuated transmitted beam (H. A. Bethe, Phys. Rev. 66, 163, 1944; T. W. Ebbesen, et al., Nature (London) 391, 667, 1998).

However, an extraordinary transmission phenomenon is seen to take place when light interacts with an array of sub-wavelength apertures in an opaque metal sheet. In 1998, Ebbesen, et al. made the remarkable observation of transmission efficiency from sub-wavelength circular apertures which was orders of magnitude greater than predicted by a standard aperture theory. Experiments provided evidence that the unusual optical property was due to the coupling of light with plasmons on the surface of the periodically patterned metal film. It was also observed that arrays of such holes display highly unusual zero-order transmission spectra at wavelengths larger than the array period beyond which no diffraction occurs. In addition, sharp peaks in transmission were observed at wavelengths as large as 10 times the diameter of the cylindrical apertures.

It is believed that light incident on a metal thin film establishes oscillations in the mobile charge density (ripples in the "Fermi sea"). These ripples, or plasmon excitations in the metal foil give rise to an evanescent mode of re-radiation that has been used in the past for contact printing. In addition, the ripples also excite the cavity modes of circular apertures in the thin film. These cavity modes act as intense light sources propagating into the far-field, drawing energy from their surroundings on which light is incident. The net transmission is far greater than the aperture area would dictate if taken alone.

It would be highly desirable to use the discovery of the plasmonic effect and extraordinary transmission phenomenon of the light interaction with an array of sub-wavelength holes formed in an opaque metal sheet to provide inexpensive ultra-high resolution sub-wavelength lithographic system for fabrication of semiconductor integrated circuits, data storage, as well as in microscopy, bio-photonics, etc.

Referring to FIG. 1, a conventional mask 10 for photolithography has a continuous clear pattern 12 formed in an opaque mask plate 14. The clear region 12 of the conventional mask is formed at a location, and sized and shaped to permit "imprinting" of a micro- or nano-feature on a substrate (wafer) as it is conventional in the photolithography. In order to "write" a pattern on the mask, a focused ion beam (or electron beam) is scanned over the mask addressing all pixels corresponding to the clear region. In this mask, the fill-factor, e.g. the ratio of the clear-to-opaque area is quite large. The necessity to expose all pixels of the opaque mask plate corresponding to the clear region requires a lengthy writing process for the conventional mask. Therefore, it would be highly desirable to reduce the "writing time" in the mask fabrication.

SUMMARY OF THE INVENTION

It is therefore an object of the present invention to provide a photolithographic mask exhibiting enhanced light transmission due to the plasmonic excitation of the incident light in sub-wavelength apertures formed in an array formed in the mask to collect and re-radiate optical energy suitable for imaging nano patterns in ultra-high resolution photolithographic printing.

It is another object of the present invention to provide a photolithographic mask using sub-wavelength apertures formed in a metal film in which the fill-factor (ratio of clear-to-opaque area of the mask) is significantly reduced to result in the reduced "writing time" of the mask, and consequently, resulting in increased mask fabrication throughput when using direct-write technologies.

Further, it is an object of the present invention to provide a photolithographic mask having arrays of sub-wavelength apertures formed in the opaque electrically conducting surface coating of the mask for effectively coupling the illuminating light with the mask surface in such a way as to excite surface plasmons of wavelengths smaller than that of the incident light.

It is still an object of the present invention to provide a photolithographical mask having apertures arrays defining patterns area of the mask plate for ultrahigh resolution photolithographic printing where a collective optical excitation propagates into the far-field with sufficient intensity onto a photoresist on a substrate to attain a continuous image imprinted in the photoresist.

It is another object of the present invention to provide a photolithography mask which is defect resilient, e.g., where the absence of one or a few apertures in arrays thereof does not seriously degrade the far-field pattern (image) created by the collective scattering from the sub-wavelength apertures array, and where image imprinted on the photoresist (wafer) exhibits satisfactory edge acuity and robustness against the normally encountered mask defects.

It is still a further object of the present invention to provide a photolithography mask including apertures arrays, where correctional holes are formed at specific locations of the arrays to improve the shape of the micro- and nano-features imprinted on the wafer of interest.

It is an additional object of the present invention to manufacture photolithographic mask amenable to obtain dimensions of the projected image (features on the photoresist or wafer) smaller than the wavelength of the illuminating light.

The present invention, in one aspect, constitutes a photolithographic mask suitable for use in nano-lithography, where the photolithographic mask is positioned in a predetermined relationship with a wafer and is illuminated by a radiation (light) to imprint at least one feature on the wafer in correspondence with a pattern "written" on the photolithographic mask.

The photolithographic mask includes a photo-plate made as a layer of an electrically conducting optically opaque material (preferably, Ag, Al, or Cr) formed on an optically transparent material, for example, glass (preferably quartz). At least one pattern area is defined at a predetermined location of the photo-plate. The pattern area includes a periodic array of apertures of a predetermined size perforated through the layer of the opaque material of the photo-plate. The apertures are spread out over the pattern area in a predetermined order and spaced each from the other by a predetermined distance. The size, spacing distance, the order of positioning the apertures, as well as the illumination dose, determine the parameters of the micro- and nano-features to be imprinted on a wafer (photoresist). The characteristics of the photolithographic mask, as well as the excitation dose of the light are optimized for each particular circuitry feature to be imprinted at the wafer. It is important that the size of the apertures is in the range of sub-wavelength, e.g., smaller than the wavelength of the incident radiation.

Any number of pattern areas may be created in the opaque mask plate depending on the design of the circuit to be created at the wafer of interest. The characteristics of the aperture arrays in each pattern area of the mask may be chosen independently one from the other, or may correspond to each to the other, e.g., the size of the apertures, size and shape of the array, spacing between apertures, etc. may be chosen to be identical or distinct in respective pattern areas on the mask.

Correctional holes may be formed at the corners of the aperture arrays to improve the shape of the features to be imprinted on the wafer. Preferably the correctional holes at the corners of the aperture arrays are arranged in a matrix, for example 3×3 matrix in order to "square" the corners of the printed features.

In another aspect of the present invention, a method of manufacturing the photolithographic mask with reduced "writing" time is provided. The mask which has sub-wavelength aperture arrays may be fabricated by any "writing" technique including, for example, Focused Ion Beam, where the focused beam of a predetermined intensity is aligned with a location of each aperture to be formed and mills through the mask plate. The beam further moves to another location—and the operation is repeated. Increased throughput for the mask fabrication and significant fabrication savings may be obtained even when using current direct-write technologies because it is necessary to mill through the film only at a small number of sites within a pattern feature (area) rather than milling the entire area of the feature. This is also referred to as a reduced "fill factor" and leads to reduced "writing time".

The current method for fabrication of the mask in question contemplates optimization mechanism for optimizing apertures size, spacing, array shape, etc., for attaining the optimized printing conditions for creating a particular integrated circuit on the wafer. These mask parameters are optimized for each particular feature (circuit design) to be imprinted on the wafer in correlation with the illumination dose and wavelength of the incident light, as well as in correspondence with the material of the mask photo-plate.

These and other features and advantages of the present invention will be understood after reading a further description of the preferred embodiment in conjunction with the patent drawings.

DESCRIPTION OF THE PREFERRED EMBODIMENTS

Figure 1:
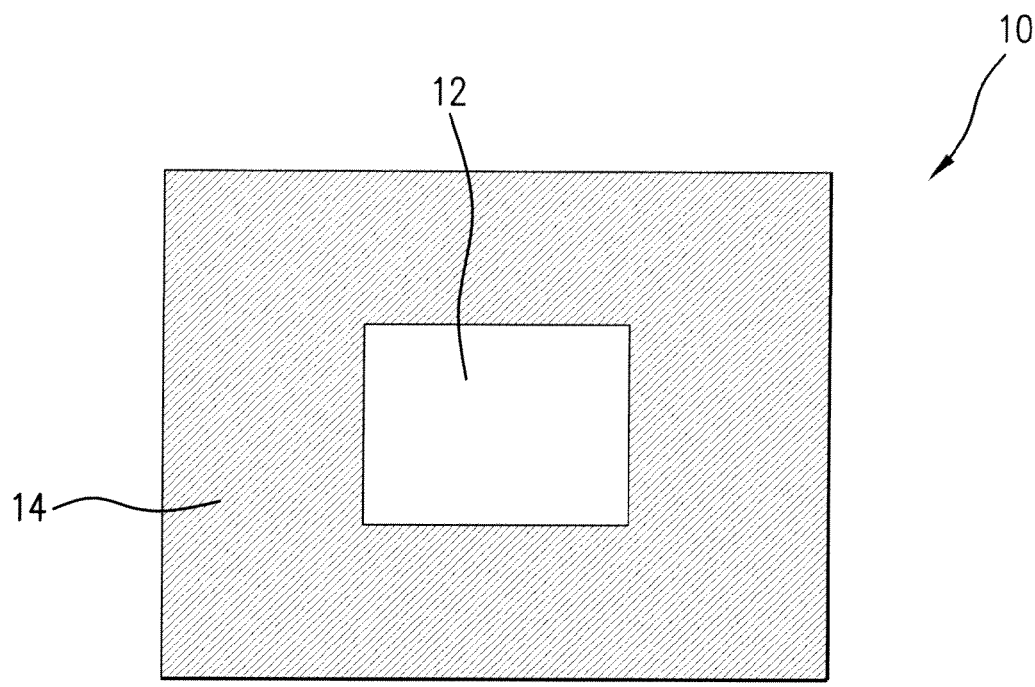
FIG. 1 is a schematic representation of the conventional photolithographic mask.
Figure 2:
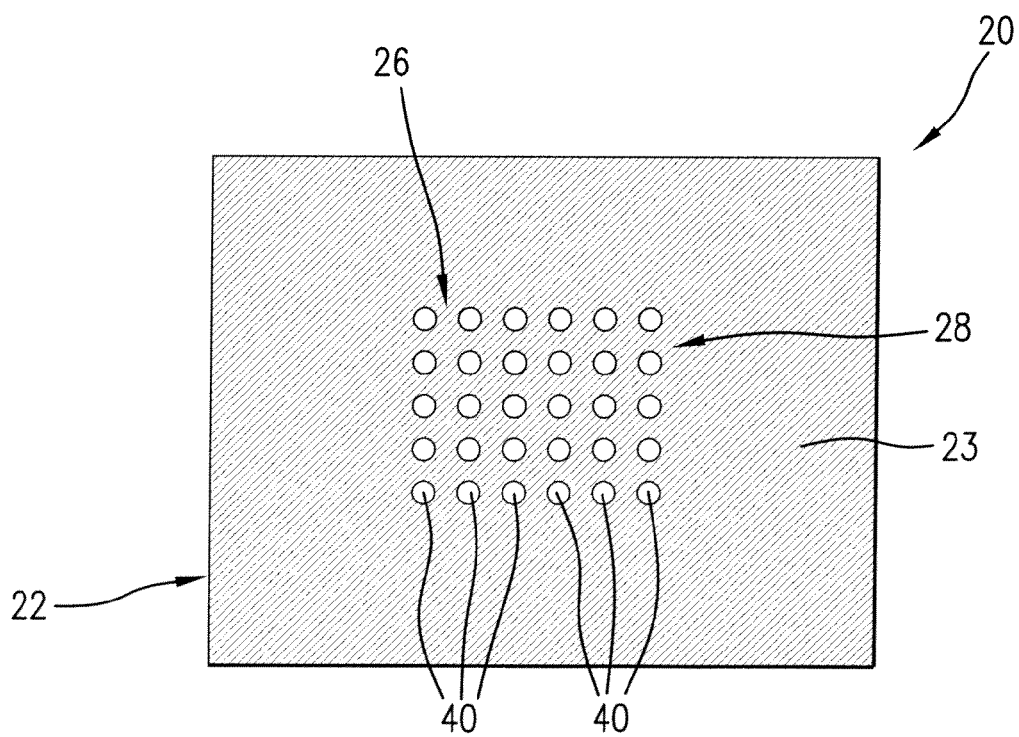
FIG. 2 is a schematic representation of the mask of the present invention showing an array aperture formed in a pattern area of the mask photo-plate.
Figure 3:
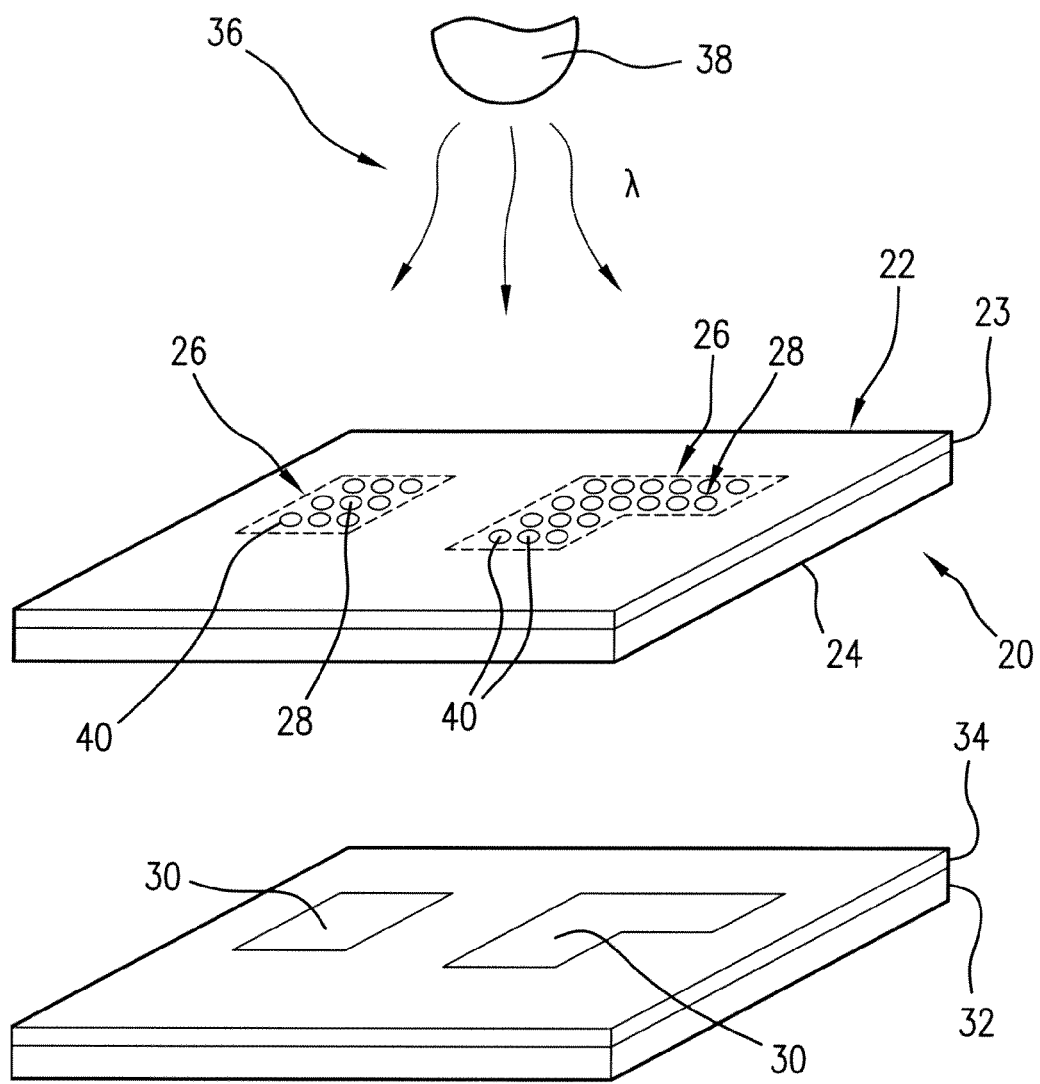
FIG. 3 is a simplified representation of the photolithographic system using the photolithographic mask of the present invention.

Referring to FIGS. 2 and 3, mask 20 includes a mask plate (also referred to herein as a photo-plate) 22 formed as a layer 23 of an electrically conducting and optically opaque material, such as, for example, Ag, Al, or Cr, deposited on a mask substrate 24 fabricated from an optically transparent material, such as, for example, glass, quartz, etc. The layer 23 is preferably a thin layer having a predetermined thickness which can be milled through, for example, by a Focused Ion Beam (FIB), as will be described in further paragraphs, during an appropriate exposure time. As an example, the thickness of the opaque layer 23 may be chosen in the range of 100 nm. As shown in FIGS. 2 and 3, the mask 20 may be formed with a single or a plurality of pattern areas 26 in each of which an aperture array 28 is formed.

The layout of the mask 20, e.g. the number and the shape of pattern areas 26, location thereof on the mask plate 22, spacing therebetween, shape of the aperture array therewithin, spacing between the apertures, as well as the apertures size, etc., is fabricated based on the integrated circuit design, etc., shape, size and disposition of features 30 to be imprinted on a wafer 32 in the photolithographic arrangement presented in a simplified form in FIG. 3.

In order to imprint the features 30, the wafer 32 is covered with a layer of photoresist 34 which is exposed to radiation 36 emanating from the radiation source 38 through the mask 20. Although it is shown in FIG. 3, that the mask 20 has two pattern areas 26 of distinct shapes and with differently spread apertures 40, it will be readily apparent to those skilled in the art that any number of the pattern areas 26, of similar or distinct shapes, with similar or distinct aperture arrays 28 therewithin, are contemplated in the scope of the present invention, subject to the design of the features and circuitry to be formed on the wafer 32.

Once the photoresist is exposed to the intense light patterned in accordance with the mask image, the photoresist in the areas of exposure changes its chemical features. Positive photoresist becomes chemically less stable when exposed; while negative photoresist becomes more stable. The chemical change permits some of the photoresist to be removed by a "developer" solution. When exposed to the developer, the areas of the positive photoresist which were not exposed to the light, are left alone on the substrate in correspondence with the mask image. In the following step, e.g. etching step, a liquid ("wet") or plasma ("dry") chemical agent removes the uppermost layer of the substrate in the areas that are not protected by photoresist thus forming elements of the integrated circuit to be formed in/on the substrate.

Figure 4:
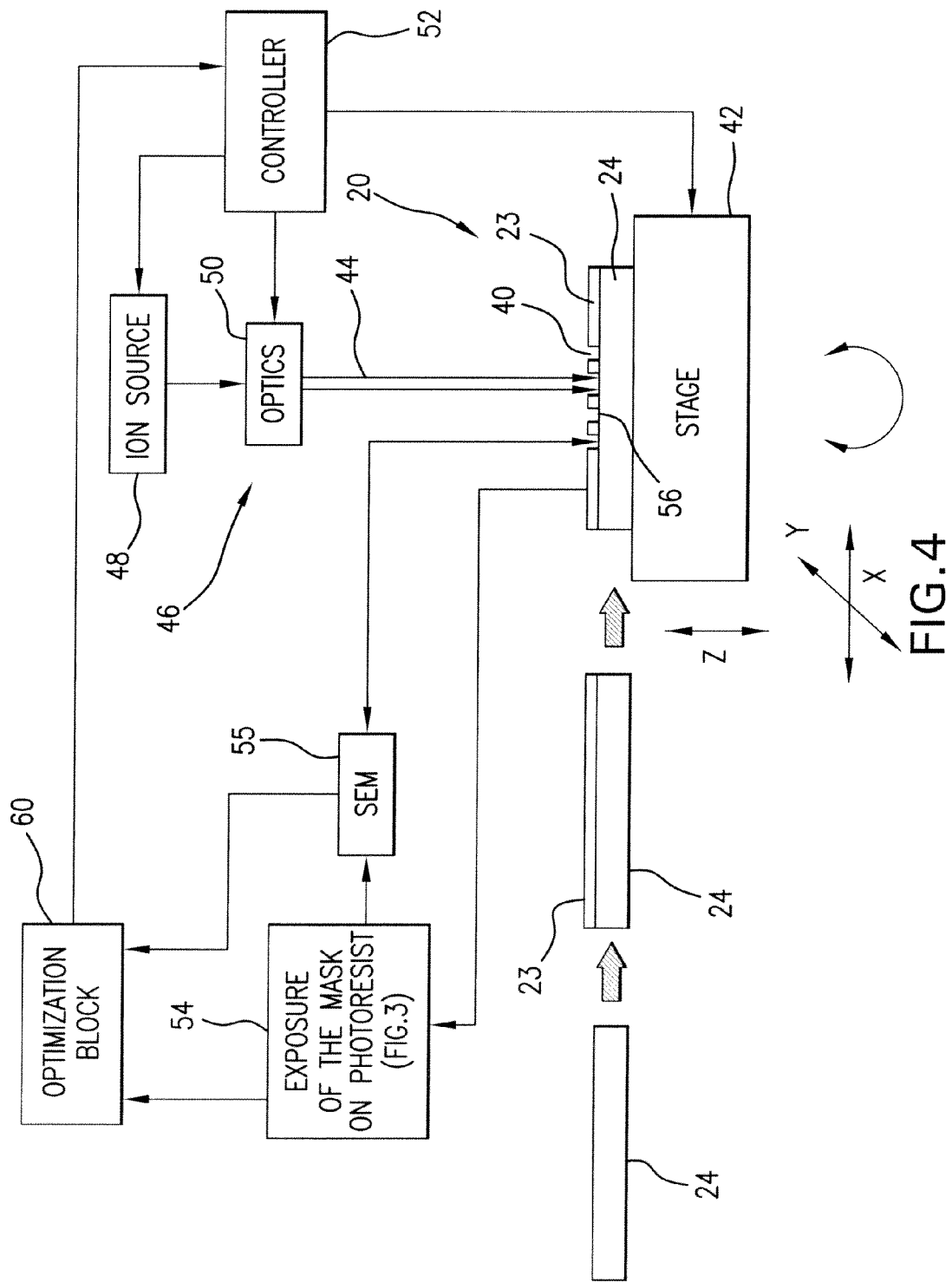
FIG. 4 is a schematic representation of the fabrication scheme for manufacturing the mask of the present invention using the FIB writing technique.

Referring to FIG. 4, which is a schematic representation of the fabrication process of the mask 20, an electrically conducting film 23 is deposited on the mask substrate 24 formed of an optically transparent material. For example, a 100 nm thick Ag film 23 may be thermally evaporated on a 6×6 square inch quartz substrate 24. The mask substrate 24 with the silver film on the top of it is placed on a stage 42 and is secured thereat by means known to those skilled in the art, for instance by a suction mechanism. The stage 42 is capable of x-y-z reciprocation, as well as bidirectional rotational motion.

Although any "direct-write" technique is contemplated in the present arrangement for fabrication of the mask 20, as an example only, and not to limit the scope of the present invention, the Focused Ion Beam "writing" will be described further for simplification purposes.

The film 23 is exposed to a Focused Ion Beam (FIB) 44 which mills substantially cylindrical apertures 40, sequentially—one after another, through the layer 23 to form the aperture array. Only the points at which apertures are to be formed, are exposed to the ion beam. The material between the points of the apertures is not exposed to the ion beam, and therefore is not milled away. Using this approach, e.g., addressing only the points of the apertures, permits a significant reduction of the "fill-factor" of the mask; and, as the result, reduces the "writing time".

The FIB system 46 includes an ion source 48 which generates an ion beam which further passes through ion beam optics 50 which provides a focusing of the ion beam. The entire arrangement of the FIB lithography uses a vacuum system (well known to those skilled in the art) which is not discussed in detail. The ion source 48 is a liquid metal source. Usually Ga is used which has a low melting point around 34° C., low thermal dispersion, low wave pressure, operation without heaters and lifetime above 1000 hours. This source is also compatible with high vacuum systems with radio single charged ions Ga+.

A controller 52 controls the position of the stage 42 with regard to the ion beam 44 to provide the point-by-point scanning of the focused ion beam 44 with regard to the layer 23 of the mask 20. The controller 52 also controls the ion beam source operation to generate the ion beam of a predetermined profile and of a predetermined intensity during a predetermined time period sufficient to mill the cylindrical apertures 40 of a predetermined diameter through the entire thickness of the layer 23. The predetermined diameter of the apertures may be in the range of about 100 nm, however, smaller diameters of the apertures are also contemplated in the masks if light sources of shorter wavelengths are used for features exposure in the photolithography process. The aperture diameters may range from ½ to ⅓ of the light wavelength emanating from the radiation source 38 shown in FIG. 3. The wavelength of the light 36 incident on the mask 20 may range, for example, from approximately 197 nm (and lower) to approximately 248 nm.

The ion beam size at the target (e.g. at the surface of the layer 23) is limited by the ion beam current, source size, and operation of electrostatic lenses in the ion beam optics 50. As the average, the FIB instruments have a focal spot size below 5 nm at a current of a few pA. However, an ion beam having a focal spot up to 50 nm may also be used to "drill" the apertures. For a given apparatus, milling times can be minimized by allowing the ion beam current to be as large as it can be without the diameter becoming too large to mill the desired size aperture. As an example, for a 50 nm diameter beam running at 10 picoamps, the time required to drill through a 100 nm film is less than one third of a second. This is equivalent to having the beam directed at the location desired to drill until 3 picocoulombs of singly charged ions have been delivered. Practical resolution for the described system is in the range of few tens of nanometers.

Alternatively, although the FIB technique is presented in FIG. 4, the electron beam "writing" of the mask may also be used for fabrication of the mask 20. However, in contrast to the FIB technique, the electron beam "writing" contemplates a resist sputtering on the top of the layer 23 and imparting the pattern information to the layer 23 through the resist exposed to the electron beam. The FIB "writing" is applicable for rapid "mask writing" while e-beam "writing" uses an additional technological step (e.g., deposition of a resist layer on the layer 23), and therefore is more time consuming. Additionally, the FIB is advantageous over the electron beam technique in that it allows simultaneous observation of the treated surface. However, the disadvantage of the FIB lithography is a relatively low penetration depth and possible radiation damage which may occur in most cases of direct mask "writing".

Figure 5:
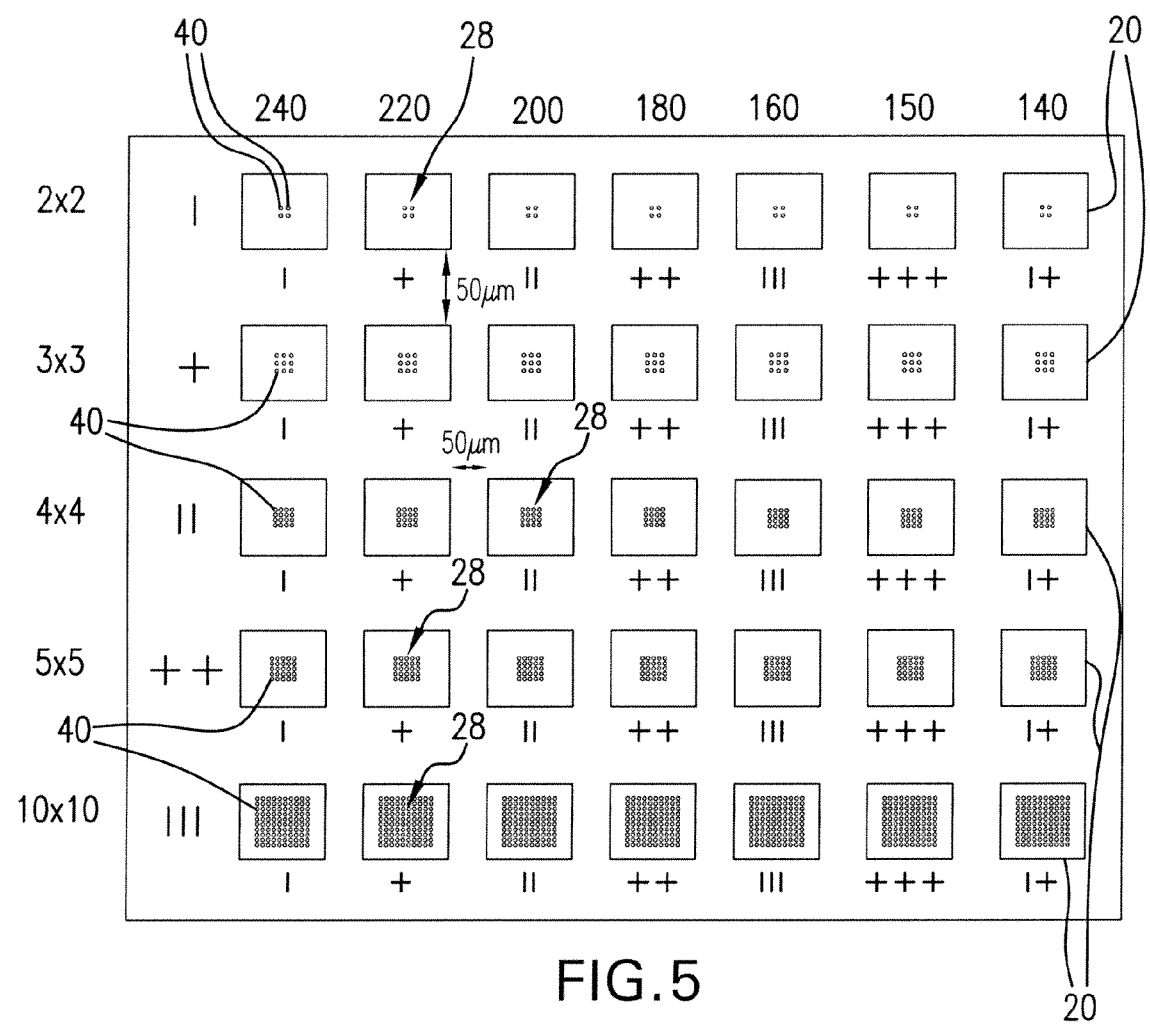
FIG. 5 presents alternative aperture arrays formed in the mask of the present invention.
Figure 6:
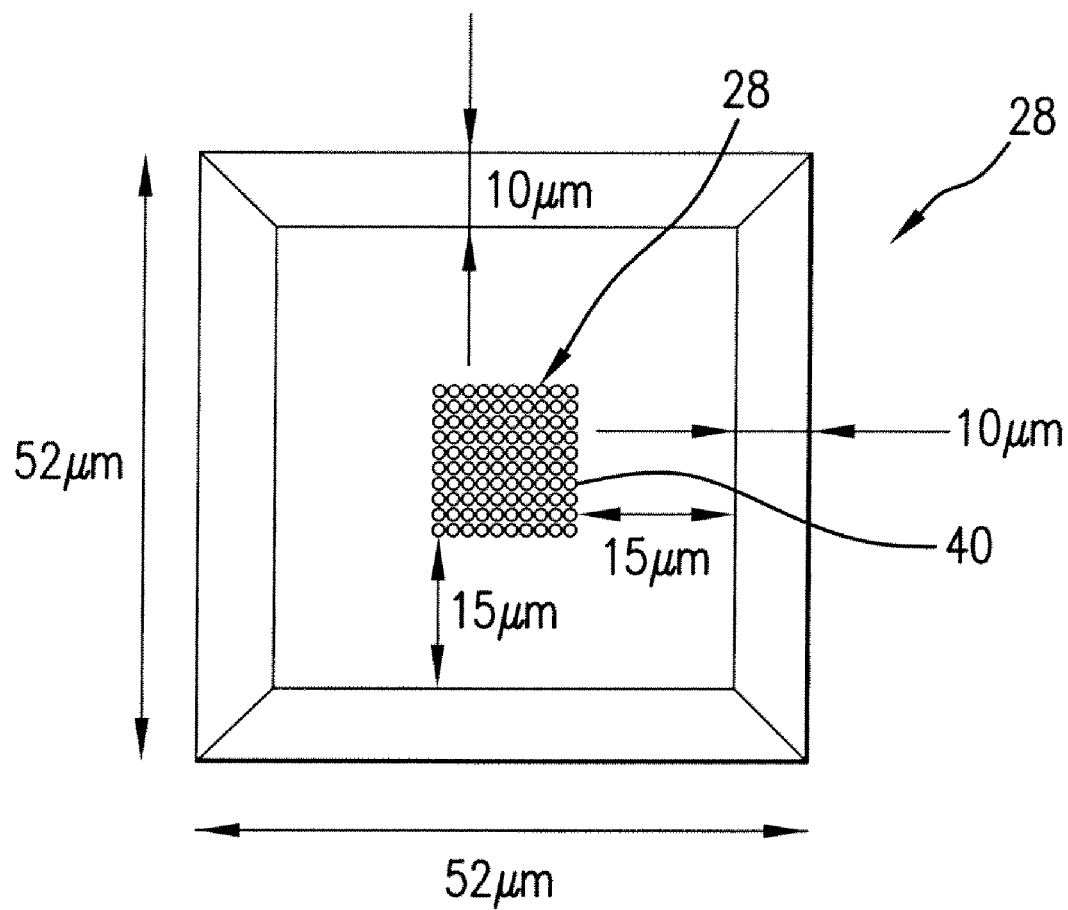
FIG. 6 is a schematic representation of one of alternative embodiments of the mask with corresponding dimensions.

The number of apertures 40 in each aperture array 28 milled in the electrically conductive opaque film 23 may vary. In addition, the aperture spacing (center-to-center) between the milled apertures may vary as well. As an example, the spacing may vary in the range 140 nm-320 nm. For example, as shown in FIG. 5, the arrays having 2×2 through 10×10 apertures were fabricated. The hole spacing was varied from 140-320 nm. The diameter of the milled apertures was in the range of 100 nm. FIG. 6 shows an example of geometrical dimensions of a produced mask having a 10×10 aperture array.

Figure 7A:
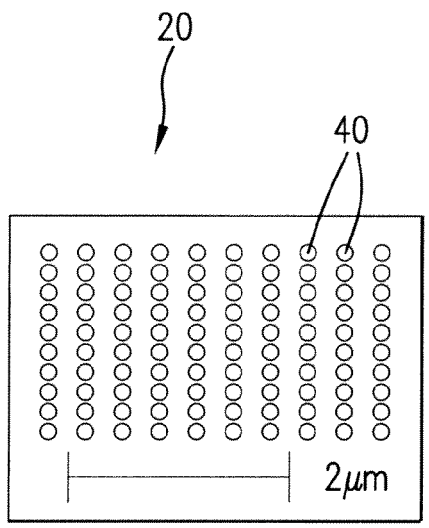
FIGS. 7A-7D are SEM (Scanning Electron Microscope) images of alternative embodiments of the masks of the present invention.
Figure 7B:
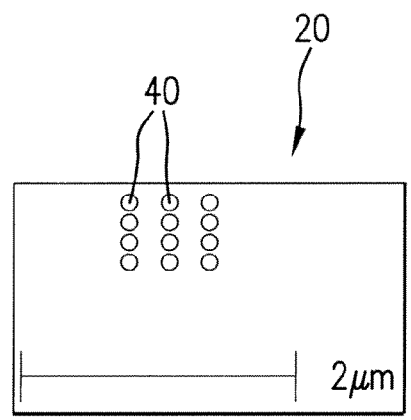

The scanning electron microscopy (SEM) images of four arrays formed in the arrangement presented in FIG. 4 are illustrated in FIGS. 7A-7D. FIG. 7A represents the image of a 10×10 array with 320 nm hole spacing, while FIG. 7B shows a 3×3 array with 280 nm hole spacing. The vertical slit-like appearance of the columns in the array in FIG. 7B is due to the astigmatism of the ion beam during the milling procedure. However, the exit aperture 56 at the bottom of the metal film 23 (shown in FIG. 4) is circular.

Figure 7C:
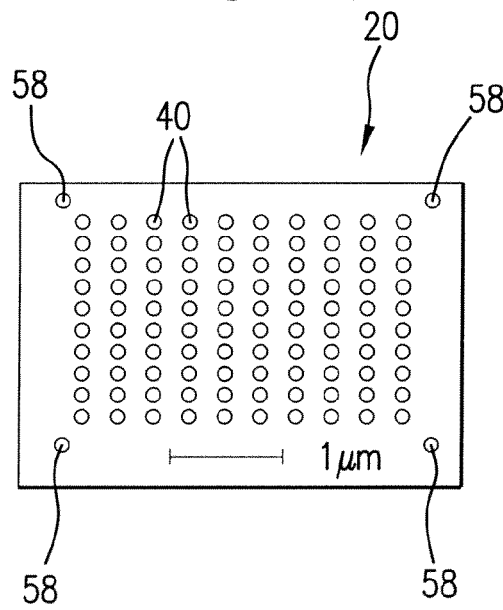
Figure 7D:
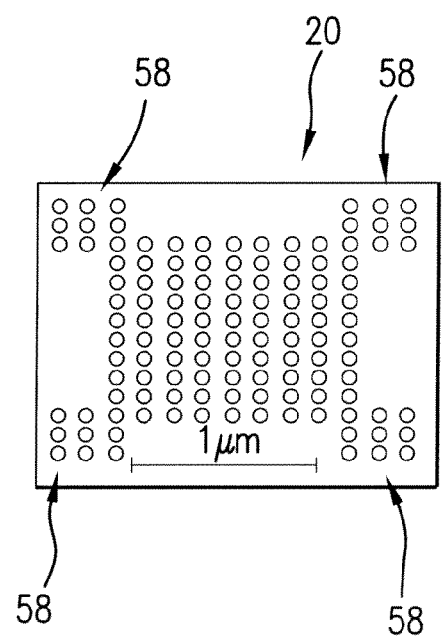

FIGS. 7C and 7D demonstrate the modifications that may be done to a conventional square array 28 to square up the projected image of the array on the wafer (photoresist). These modifications, also referred to herein as correctional structures 58, are placed at each corner of the aperture array to improve the shape of the feature imprinted on the wafer that will be presented in further paragraphs. For example, as shown in FIG. 7C, a single hole is placed diagonal to each corner of the array, while in FIG. 7D, a 3×3 array of holes is placed in each corner of the array.

The fabricated masks were studied to explore the effects of aperture spacing, array size, as well as the influence of the correctional structures 58 to improve image transfer fidelity. For this, a 248 nm mercury exposure (radiation) source was used for imaging the mask via a 4× projection printing tool (for example ASML QML full field stepper configured for 0.25 μm resolution) on a 0.78 μm thick UV26 photoresist spun on a silicon wafer. It is anticipated that the results of the study are applicable to systems with higher numerical aperture (NA), allowing for extension to higher feature resolution. It is clear, that changing the exposure wavelength may affect the coupling of the incident beam to the plasmonic excitation modes. The exposure of the photoresist through the mask as shown in FIG. 3, was done at various foci and intensities of the light.

The excitation wavelength $\lambda$ corresponds to a charge excitation above the surface plasmon resonance. Contrary to the case of a free electron gas where a propagating mode would not exist at frequencies above the surface plasmon resonance, a real propagating mode is created in the metal (silver) film 23 of the mask 20 for frequencies above the surface plasmon resonance. For each hole spacing arrangement, the array 28 of holes 40 forms a square shaped feature 30 on the wafer (photoresist) with the following equation describing the linear dimension, T, of the square structure 30:

$$T=0.25[(x-1)d+D]  \quad (Eq. 1)$$

where d represents the hole spacing, D is a diameter of the holes (100 nm or smaller), and x is the number of holes in a line of the square array, i.e., x=10 in a 10×10 array.

Once the mask is projected on the wafer coated with UV26 photoresist, the resulting patterns (features) 30 shown in FIG. 3 are captured via SEM images and measured. A measured dimension is compared to its expected value, T, also referred to as the nominal critical dimension (nominal CD), as calculated using Eq. 1. The dimensions of the features imprinted on the wafer using the mask 20 may be attained which range from 45 nm to 500 nm and higher.

Figure 8A:
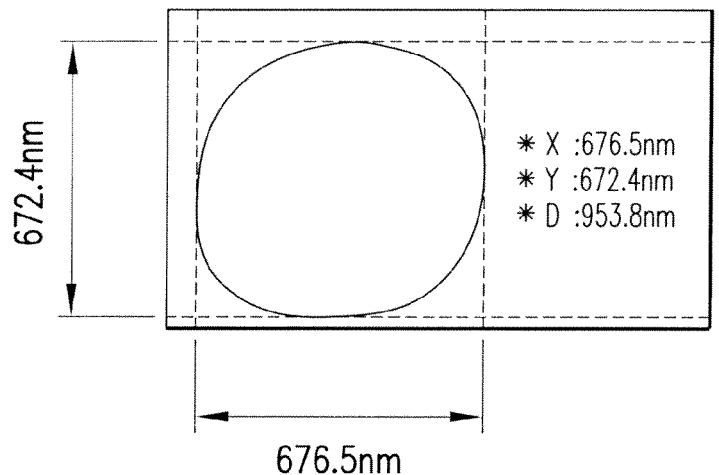
FIGS. 8A-8C are SEM images of the resolved pattern on the wafer (photoresist)
Figure 8B:
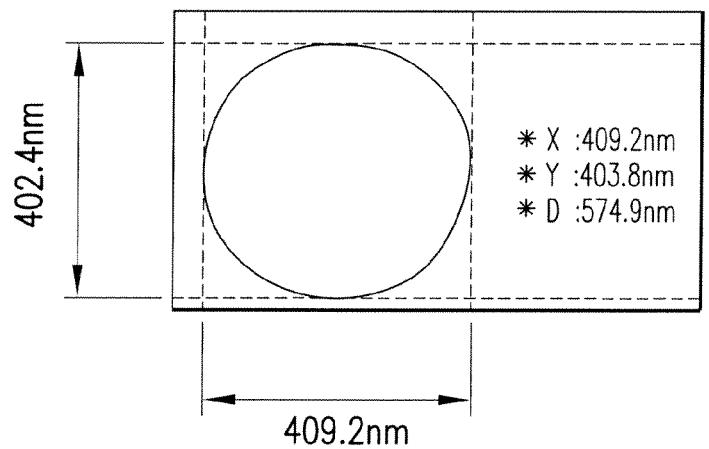
Figure 8C:
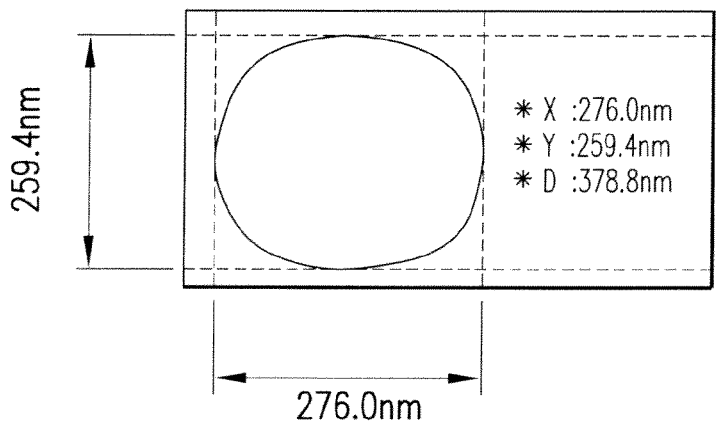

For example, for a 10×10 array with 300 nm hole spacing, the array size on the mask is 2.8×2.8 μm², with an expected 4× projected image of 0.7×0.7 μm². The SEM images of the resolved features 30 on the wafer are shown in FIG. 8A-8C. For FIG. 8A, where the 10×10 array with 280 nm hole spacing is used, nominally x, y is 655 nm, 655 nm. The obtained x, y is 676 nm and 672 nm respectively. For FIG. 8B, using the mask with 7×7 array with 260 nm hole spacing, the nominal x, y is 415 nm, 415 nm, and the obtained x, y is 409 nm, 403 nm, respectively. For FIG. 8C, using the mask with 5×5 array with 220 nm hole spacing, the nominal x, y is 255 nm, 255 nm, and obtained x, y is 280 nm, 260 nm, respectively. Thus, using a 248 nm radiation source 38 shown in FIG. 3, the printed feature with the dimensions 260 nm is successfully imaged as shown in FIG. 8C.

Figure 9A:
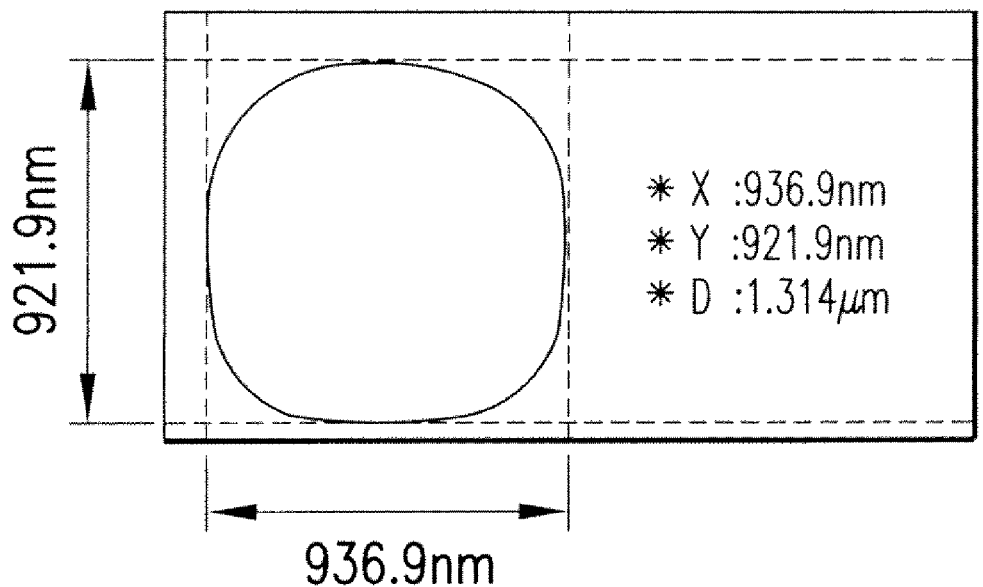
FIGS. 9A-9B are SEM images of resolved pattern on the wafer (photoresist) showing the effect of correctional holes on the edge acuity received by employing the arrays of FIGS. 7C and 7D respectively.
Figure 9B:
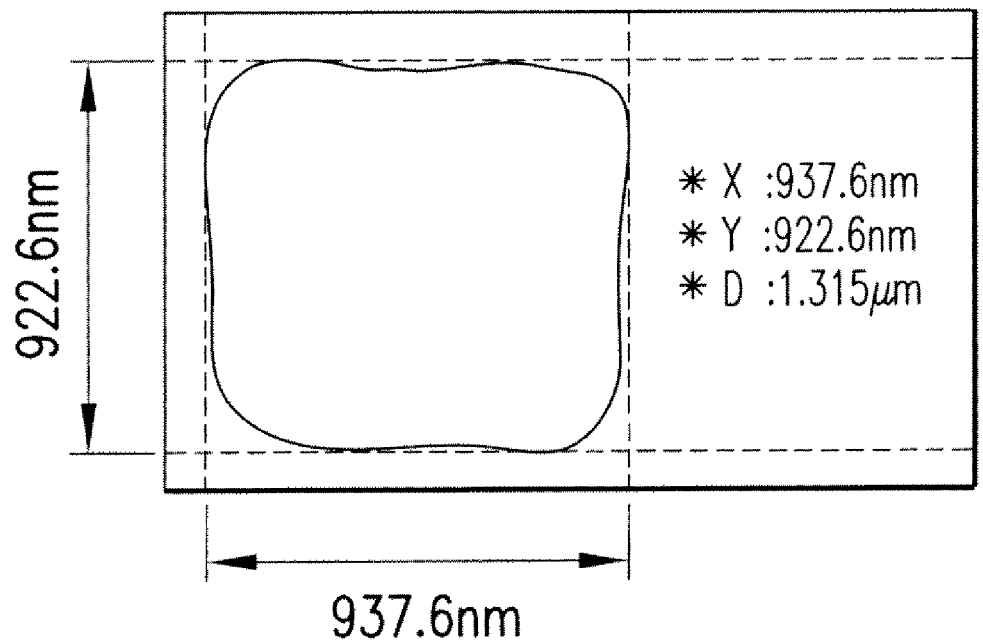

An attempt to sharpen the rounded corners of the resolved features shown in FIGS. 8A-8C, has been performed with the use of the patterns shown in FIGS. 7C and 7D, where the added correctional pixels (or matrices) 58 were implemented to fill in the corners of the aperture arrays 28. The addition of the correctional structures 58 shown in FIG. 7D was successful in obtaining the squared corners of the imprinted features on the wafer, e.g. the correctional structure 58 with the 3×3 array at the corners of the array improved future linearity as may be observed in FIG. 9B. However, the pattern with a single correctional hole placed diagonal to each corner of the array edges shown in FIG. 7C had a very insignificant positive effect on squaring the corner as may be observed in FIG. 9A.

Figure 10:
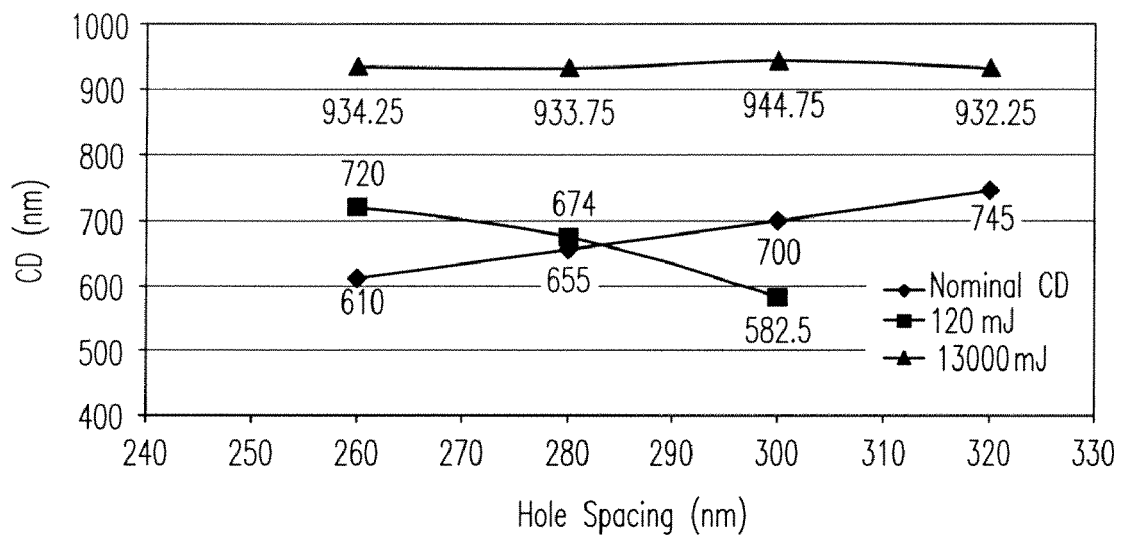
FIG. 10 is a diagram representing feature size vs. hole spacing at different radiation doses.

A study of the mask pattern stability as a function of exposure dose (e.g., the amount of light transmitted to the wafer through the mask) demonstrates the exposure system stability. As expected, the exposed feature size on the wafer (photoresist) increases and saturates as the applied exposure dose is increased. When proper exposure dose is selected and used, then the hole spacing and array sizes dictate the sizes of the exposed patterns. In other words, a match between the exposed feature sizes and the expected nominal CDs varies as a function of hole spacing and light dose as presented by the diagrams shown in FIG. 10.

Figure 11:
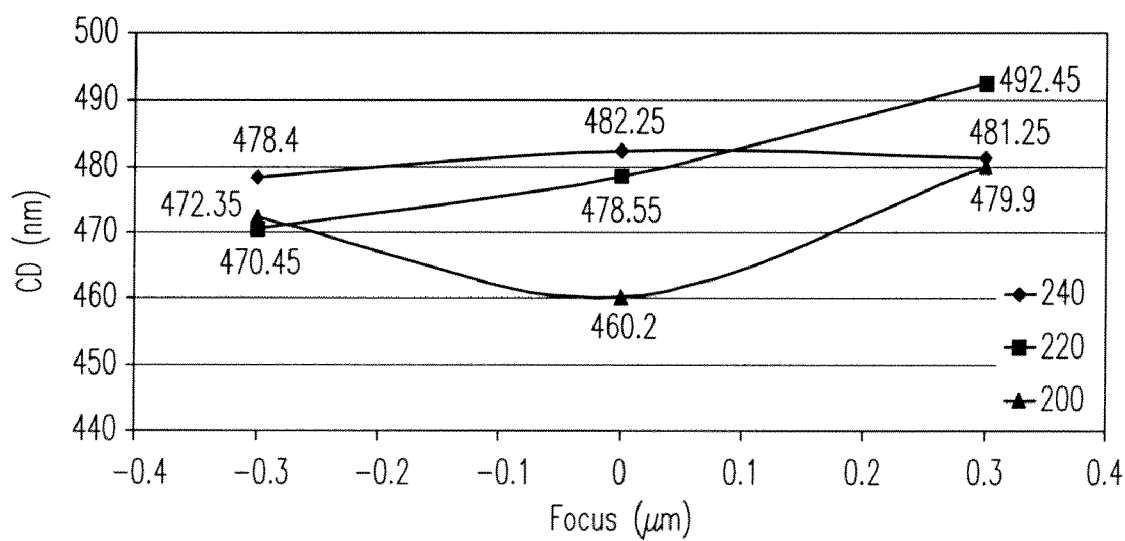
FIG. 11 is a diagram representing feature size vs. focus of 7×7 arrays with varying hole spacing.

The stability of the imaged pattern has also been studied by offsetting the image plane from its focused position. The mask 20 is affected by focus offsets of the lens system. Changing the focus by +0.3 μm or −0.3 μm leads to changes in the size of the exposed features for different hole spacings, e.g., 200 nm, 220 nm, and 240 nm, as seen in FIG. 11.

Figure 12A:
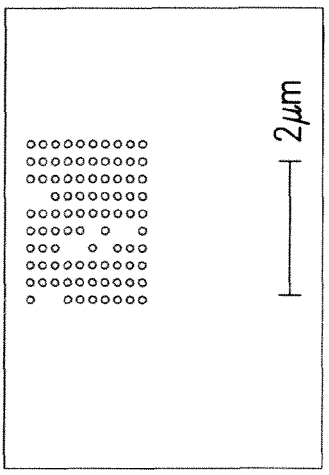
FIGS. 12A-12C are SEM images of 10×10 arrays with missing apertures.
Figure 12B:
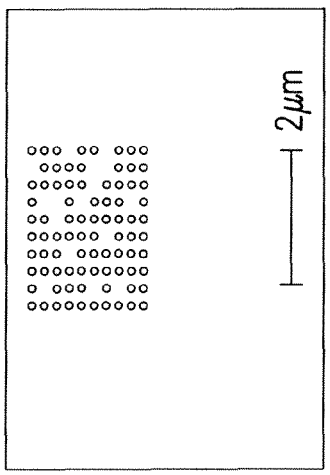
Figure 12C:
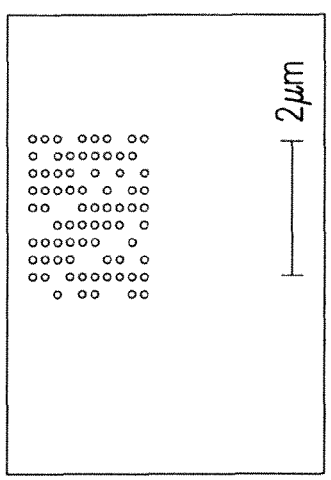

The collective nature of the electromagnetic excitation emanating from the mask apertures array was tested by omitting a set of random holes in the 10×10 arrays with 240 nm hole spacing to observe the defect tolerance of the mask. FIGS. 12A-12C show SEM images of the masks 20 with the arrays randomly missing 10, 20, and 30 apertures, respectively. These patterns were successfully fully exposed with no discontinuity, as presented in FIGS. 13A-13C for 10, 20, and 30 missing apertures, respectively. The dimensions of the resolved patterns 30 match favorably with expected (nominal) dimensions obtained from Eq. 1.

Figure 13A:
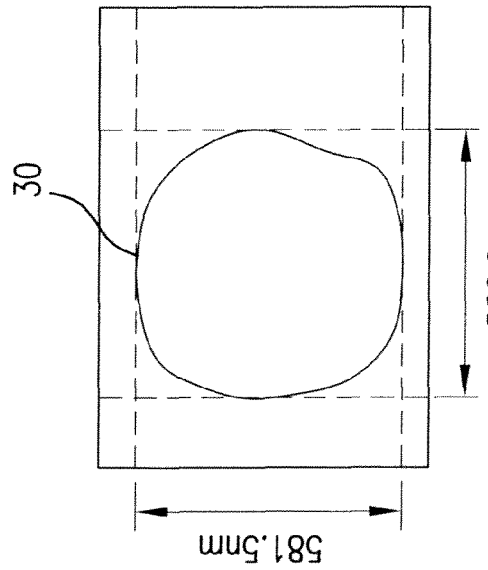
FIGS. 13A-13C are SEM images of the resolved pattern on the wafer corresponding to the masks presented in FIGS. 12A-12C, respectively.
Figure 13B:
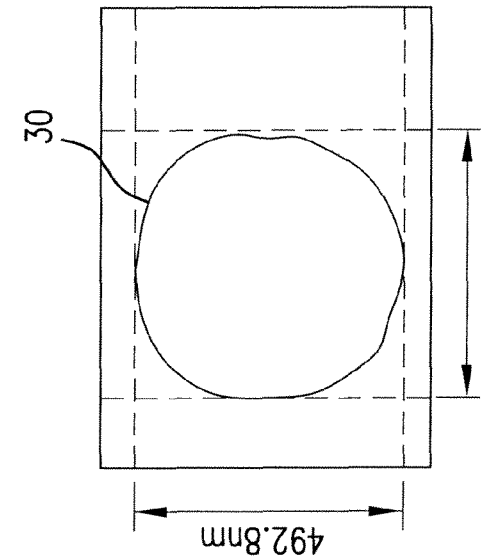
Figure 13C:
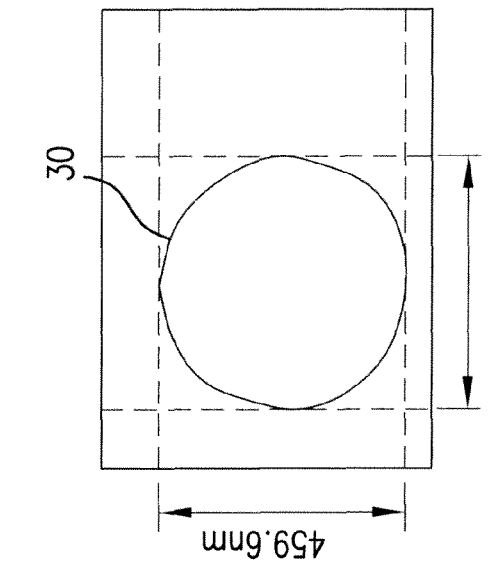

For FIG. 13A, the nominal x, y dimensions are 565, 565 nm; while the obtained x, y dimensions for the resolved feature are 586, 581 nm, respectively. For FIG. 13B, the nominal x, y dimensions are 565, 565 nm; while the obtained x, y dimensions are 495, 492 nm, respectively. For FIG. 13C, the nominal x, y dimensions are 565, 565 nm; while the obtained x, y dimensions are 461, 460 nm, respectively.

While there was some slight deformation of the shape, no unexposed photoresist was found in the resolved pattern on the wafer and, for the most part, the feature boundary size is quite close to that obtained from defect-free arrays. Some deformation is evident, but all the apertures were fully exposed and would be useful at the resolution limit of the tool employed. Again, it is emphasized that higher numerical aperture (NA) tools are expected to provide further improvement of the fidelity of the feature pattern transfer at smaller dimensions. However, a full improvement will require optimizing the sub-wavelength aperture spacing and the entire pattern diameter. The results presented in the previous paragraphs shows that the aperture array mask is based on a collective effect of the sub-wavelength apertures with a significant defect resiliency.

Referring again to FIG. 4, the controller 52 translates the stage 42 and provides the exposure regime to the ion beam source 48 in accordance with the optimization parameters supplied to the controller 52 from the optimization block 60 which optimizes the mask layout (spacing and dimension of the apertures, as well as dimensions and shape of the apertures arrays), correlated with the exposure regime (exposure dose) for imprinting the features (elements) of the integrated circuit to be created on the wafer in accordance with the integrated circuit specifications. The optimization block 60 sets the size, spacing and placement of the sub-wavelength apertures on the mask plate. As there is a considerable variation in optical material parameters, particularly in the case of metal thin films 23 for the mask plate 22, an empirical optimization approach may be used. For this, a computer graphics database (known to those skilled in the art) is sorted for key shapes for the features to be imprinted on the wafer. These key shapes are then assigned aperture spacings and diameters that have been shown to give optimum performance (such as resolution and time-to-expose) when fabricated individually.

Figure 14A:
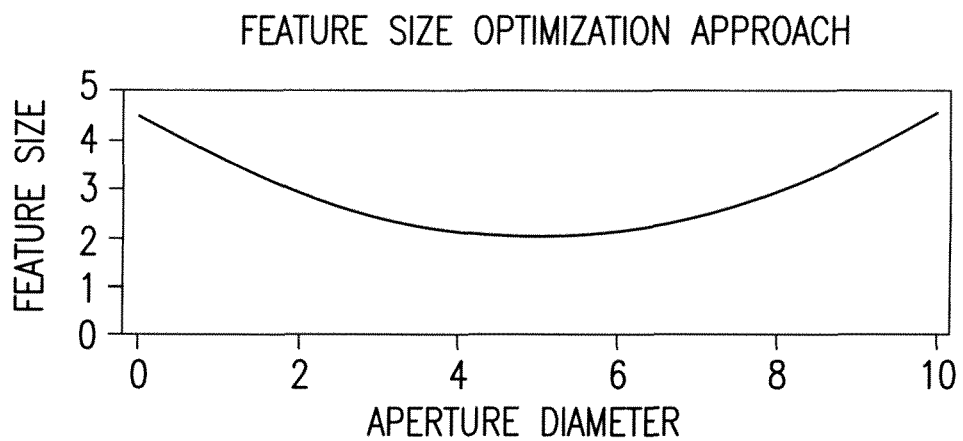
FIGS. 14A-14C are diagrams representing a feature size vs. aperture diameter, aperture spacing, and exposure dose, respectively, used in the mask parameters optimization.
Figure 14B:
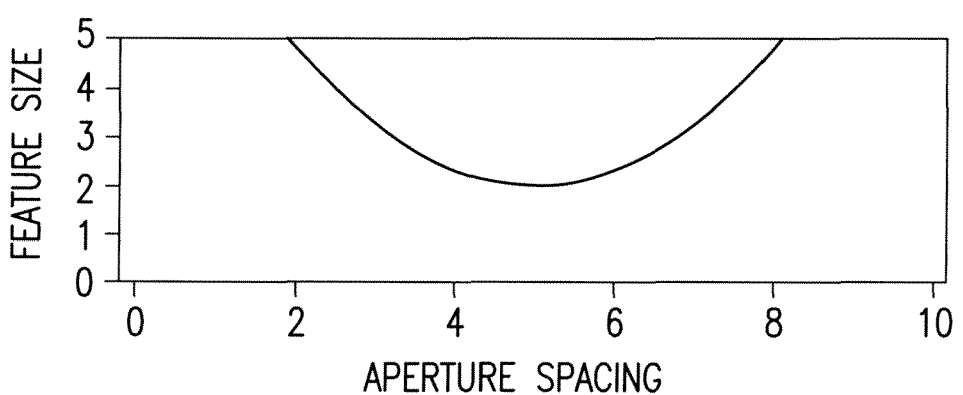
Figure 14C:
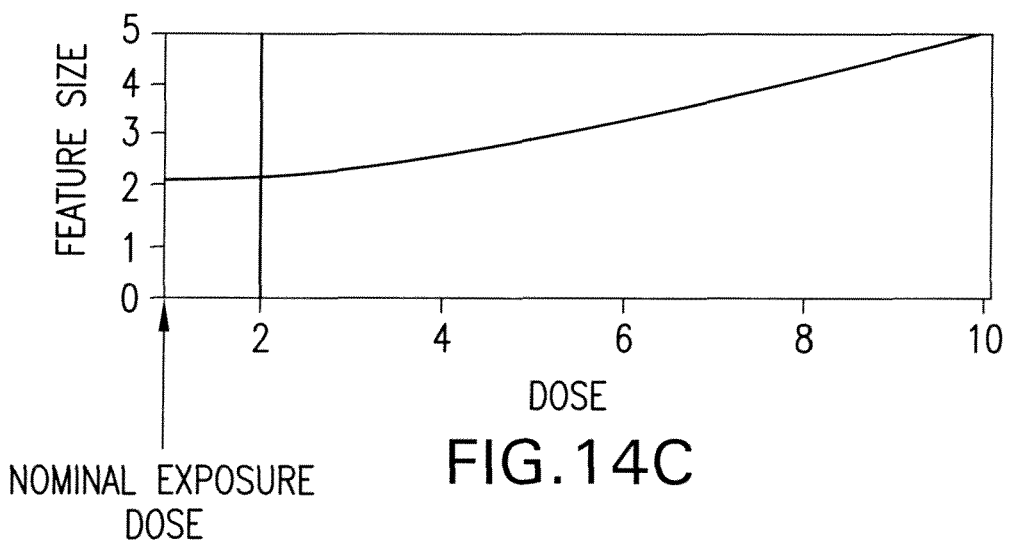

An example of this optimization approach for a basic shape of the imprinted feature may be better understood in conjunction with the diagrams presented in FIGS. 14A-14C. As shown FIGS. 14A and 14B, the aperture size and spacing is varied systematically, and the resulting masks are exposed in the operational step presented by a block 54 in FIG. 4 to create the features of the feature size presented. The shortest exposure, yielding the best resolution, e.g., feature size closest to the target, is studied by the microscopic analysis (SEM) in a SEM block 55 of the pattern developed in the photoresist on the wafer after it has been exposed to some nominal exposure dose.

Next, the pattern is exposed at a number of different exposure dose levels, as presented in FIG. 14C. If the slope of the feature size versus the exposure dose in the diagram presented in FIG. 14C is above a preferred slope in the vicinity of the nominal dose, the nominal dose is reset in an attempt to obtain a "flatter" curve. Then, once the satisfactory slope in vicinity of the nominal dose is obtained, the aperture size and spacing plots are re-run and the entire process iterated until a regime is found in which the desired feature size and minimum dose sensitivity are achieved. The feature size must be stable against exposure dose variation.

As a part of the optimization scheme, certain shapes in the sorted database may require further correction, such as the addition of "resolution enhancement features". An example would be "the squaring" of the features that initially (uncorrected) print as a circle. This is accomplished by adding the correctional structures as presented in FIG. 7D discussed in previous paragraphs.

It is a relatively easy task to sort the computer graphics pattern for each mask layer and to sort the resulting shapes by shape category. Most shapes in a given pattern will be large and will not need special lithographic considerations. Even these features may benefit from sub-wavelength exposure technology, as it will result in reduced "fill-factor", e.g. a reduced collective area to be addressed by the FIB on the mask plate. This reduced fill-factor for the manufacturing of the mask 20 may significantly improve the throughput of the mask production.

Certain feature shapes, such as tightly spaced feature groupings, crosses or minimum dimension features, will require special consideration. They may require "boundary assist" correctional structures (such as presented in FIG. 7D, to achieve necessary pattern fidelity on transfer of the mask pattern to the wafer pattern. Those features which need simple adjustment of aperture size and spacing will have the appropriate correction accomplished in the graphics database on sorting. Those features amenable to special correction will be assigned the corrections based on the discrete feature optimization described in the previous paragraphs. Advanced electromagnetic modeling codes may be used to further optimize the output.

When the optimization unit 60 accomplishes the optimization of the mask layout and the exposure regime for a particular circuit design, the optimization instructions are supplied to the controller 52 which in turn controls the stage translation/rotation and the ion beam source operational regime (exposure dose).

The mask 20 having sub-wavelength aperture presented in previous paragraphs may be used for far-field imaging, as proven by the study presented in previous paragraphs. The far-field emission through the mask was strong enough to pattern UV26 photoresist of 0.78 μm thickness. It is believed that plasmon excitation in the electrically-conductive film (such as, for example, formed from silver, or aluminum, or chromium) together with the localized excitation of the cavity modes due to the sub-wavelength apertures, is responsible for the transfer of the excitation from one side of the mask plate to the other side. An antenna-like effect takes place at the aperture openings on the back side of the mask, producing light radiation. When the apertures of the arrays subsequently radiate, there is a constructive interference between the apertures and transmission enhancement.

The study of the novel mask demonstrates that an array of sub-wavelength holes may be used to expose the photoresist on a wafer at 4× reduction using a conventional stepper. The presented approach was targeting 250 nm technology, given the limitations of the optical tools used. It is believed that this approach may be successfully applied for feature technologies in the range of 45-65 nm with the use of more powerful optical tools having higher numerical apertures and by optimizing the sub-wavelength aperture spacing and the size of the hole array.

It was shown that pattern corner sharpening may be accomplished with the resolution enhanced patterning. The use of superior optical tools is expected to sharpen the corner rounding of exposed patterns as would be required for next generation design rules. The dose required for optimal exposure may be less than 3× greater than a conventional dose.

The clear area of the exposure template for the pattern in the mask is significantly smaller than that required for "writing" on a conventional mask plate, since transparent portion of the feature on the novel mask is an array of apertures with opaque space between the apertures. In the novel mask "writing", the exposing beam does not need to dwell on the regions between the individual sub-wavelength apertures. This may lead to a significant improvement in the throughput in the masks fabrication.

The understanding of the phenomena which takes place when light travels through nano apertures is generally incomplete. However, it is suggested that the collective effect takes place in the novel mask based on plasmonic interaction. The light incident on the mask generates plasmon waves on the metal surface. These waves propagate in the plane of the mask. Further, when these waves encounter and are scattered at apertures in the metal film, they are transferred through the apertures. The waves further excite surface waves on the opposite side of the mask that can turn into freely propagating optical wave. These waves may be captured via the optics and they may be used to expose the photoresist.

The absence of up to 30% of the apertures still allow useful printing of the effected features. Neither individual resolved holes being printed nor any discontinuity in the exposed pattern was observed. The image still exhibits good edge acuity and robustness against many of the normally encountered mask defects for the targeted 250 nm features.

The results of the study demonstrate that a mask containing a 2-dimensional array of sub-wavelength apertures may be used to expose a photoresist with the same resolution as a clear aperture mask of the same size as the array, only requiring a slightly longer exposure time. Therefore, this discovery points to a new way of making photolithographic masks with a writing time potentially reduced by some fraction of the fill-factor of the array. As stated above, the actual exposure throughput improvement may be determined by the final address structure of the "writing" beam tool and the number of addressed apertures required to establish a distribution intensity resonance that reflects the desired shape and dimension. It is suggested and believed that some reductions in write time should always be possible and significant reduction in "write" time may, in fact, be possible. For this approach to be applied to state of the art design rules (45 nm, 65 nm) may necessitate the use of higher NA optical tools and the optimization of the sub-wavelength aperture spacing and the array size.

Although this invention has been described in connection with specific forms and embodiments thereof, it will be appreciated that various modifications other than those discussed above may be resorted to without departing from the spirit or scope of the invention as defined in the appended Claims. For example, equivalent elements may be substituted for those specifically shown and described, certain features may be used independently of other features, and in certain cases, particular applications of elements may be reserved or interposed, all without departing from the spirit or scope of the invention as defined in the appended Claims.

What is being claimed is:

1. A method for fabricating a far-field photolithographic mask for imprinting at least one feature at a wafer in a nanolithography, comprising the steps of:

forming a far-field photolithographic mask as a double-layer structure consisting of a first layer and a second layer by the steps of:
  (a) forming said first layer from an electrically-conducting optically opaque material of a predetermined thickness of approximately 100 nm on said second layer, said second layer being a mask substrate;
  (b) directing an energetic beam onto said first layer to mill an aperture of a predetermined diameter extending through said predetermined thickness of said first layer;
  (c) moving said energetic beam a predetermined distance from said aperture to mill at least another aperture through said predetermined thickness of said first layer;
  (d) repeating said step (c) to create at least one array of a plurality of said apertures, thereby defining at least one pattern area at said first layer, wherein said at least one pattern area filled with said array of said plurality of said apertures corresponds to the at least one feature to be created at the wafer, said apertures being spread within said at least one pattern area according to a predetermined order, wherein said at least one pattern area has a predetermined periphery including a plurality of corners; and forming correctional structures outside said at least one pattern area and adjacent said plurality of corners along said periphery of said at least one pattern area, wherein each of said correctional structures is formed by mill on n×n matrix of correctional holes by said energetic beam through said predetermined thickness of said layer, wherein n is an integer and $1 \leq n \leq 3$.

2. The method of claim 1, wherein said apertures in said at least one pattern area are milled by a Focused Ion Beam (FIB) directed towards said layer of the electrically-conducting optically opaque material.

3. The method of claim 1, wherein said predetermined distance between the apertures is in the range of 1.40 nm-320 nm, wherein said at least one array of apertures constitutes an A×B matrix of the apertures, wherein A=2, 3, . . . , 10, . . . , N, and wherein B=2, 3, . . . 10, . . . N, and wherein N is an integer.

4. The method of claim 1, further comprising the step of:
optimizing said predetermined distance between said apertures and said predetermined diameter of said apertures in correlation with an exposure dose provided by an illumination light incident on the wafer though said mask in accordance with a desired size and quality of said at least one feature to be imprinted on the wafer.

* * * * *